United States Patent [19]

Nicolai et al.

[11] Patent Number: 5,791,115
[45] Date of Patent: Aug. 11, 1998

[54] FRAME LEG FOR A RACK OF A SWITCHGEAR CABINET

[75] Inventors: Walter Nicolai, Buseck; Georg Vogel, Schwieberdingen, both of Germany

[73] Assignee: Rittal-Werk Rudolf Loh GmbH & Co. KG, Herborn, Germany

[21] Appl. No.: 724,995

[22] Filed: Oct. 3, 1996

[30] Foreign Application Priority Data

Oct. 4, 1995 [DE] Germany .................... 195 36 949.1

[51] Int. Cl.$^6$ .................................................... E04C 3/30
[52] U.S. Cl. ............... 52/730.4; 52/730.5; 52/732.3; 52/732.2; 52/734.2; 52/737.6; 52/730.1
[58] Field of Search ................. 52/730.1, 730.3, 52/730.4, 730.5, 634, 44, 732.2, 734.1, 732.3, 737.6, 734.2; 403/204, 279, 285

[56] References Cited

U.S. PATENT DOCUMENTS 5,271,204 12/1993 Wolf et al. ................... 52/732.3 X

*Primary Examiner*—Creighton Smith
*Assistant Examiner*—W. Glenn Edwards
*Attorney, Agent, or Firm*—Speckman Pauley Pertersen & Fejer

[57] ABSTRACT

A frame leg for a rack of a switchgear cabinet having two partial profile strips produced from material strips in a stamping and bending process, wherein the partial profile sections overlap each other with partial sections in connecting areas and are fixedly connected with respect to each other. The stability, the torsional stability and sealing of a frame leg of this type can be improved with negligible outlay. Prior to or during the stamping and bending process of the two partial profile sections, the partial sections included in the connecting areas are provided with a curable adhesive layer at least in one of the partial sections, and that the cured adhesive layers connect the partial sections of the two partial connecting sections included in the connecting areas in a fixed manner.

1 Claim, 1 Drawing Sheet

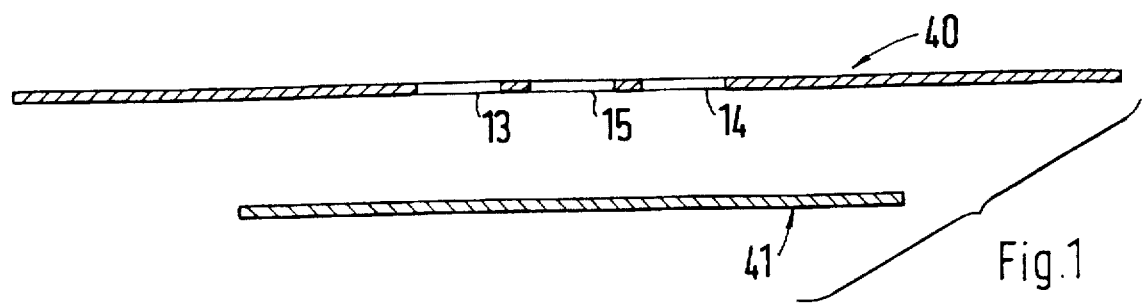
Fig. 1
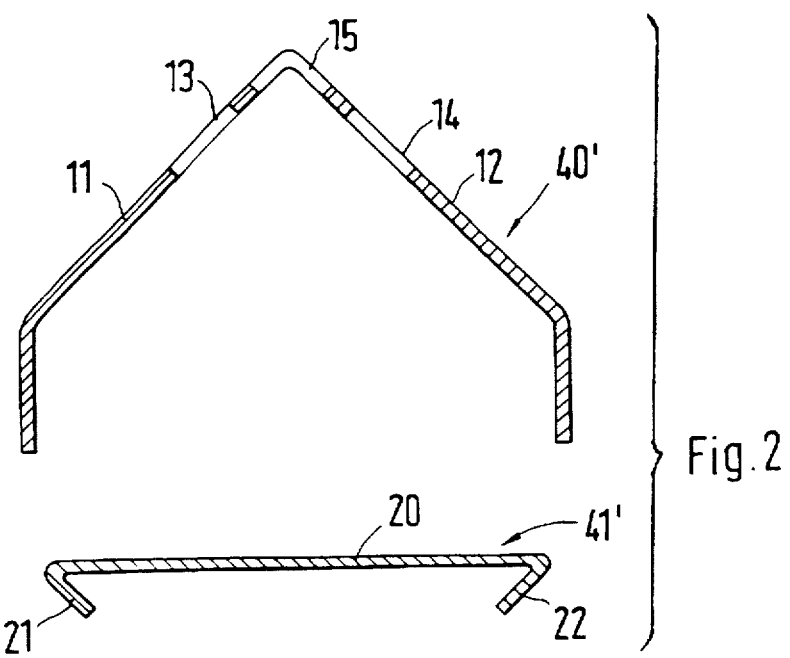
Fig. 2
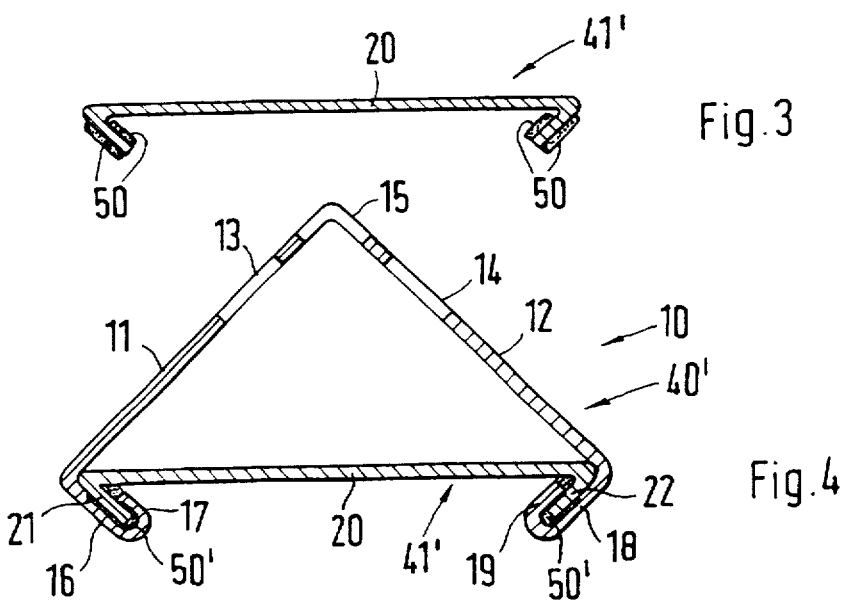
Fig. 3
Fig. 4

5,791,115

1

FRAME LEG FOR A RACK OF A SWITCHGEAR CABINET

BACKGROUND OF THE INVENTION

1. Field of the Invention

This invention relates to a frame leg for a rack of a switchgear cabinet, which has two partial profile strips produced from strips of material in a stamping and bending process, wherein the partial profile sections overlap each other with partial sections in the connecting areas and are fixedly connected with respect to each other.

2. Description of Prior Art

Frame legs of this general type are known, which have different cross-sectional shapes, wherein the partial sections of the partial profile sections resting on top of each other after the stamping and bending process are at least spot-welded together for reasons of stability, in particular for high torsional stability. This considerably increases the cost of a compound frame leg, and in addition the desired stability is not assured if the welding work is poorly performed. Often there is no absolutely sealed connection of the partial profile section provided in the connecting areas.

SUMMARY OF THE INVENTION

It is one object of this invention to produce a frame leg of the type mentioned above, considerably easier and wherein the sealed and permanent connection of the partial profile sections is automatically included in the production sequence of a completely sealed frame leg embodied as a hollow profile section, with negligible outlay.

This object is attained in accordance with this invention in that prior to or during the stamping and bending process of the two partial profile sections, the partial sections included in the connecting areas are provided with a curable adhesive layer at least in one of the partial sections. The cured adhesive layers connect the partial sections of the two partial connecting sections included in the connecting areas in a fixed manner.

In the process it is only necessary that the adhesive layers for the connecting areas of the two partial profile sections are applied during the phase of the production sequence in which at least the partial sections of one partial profile section are still open and accessible, for example for an adhesive application. Following that, the process sequence can be completed, wherein subsequently the solid and permanent connections of the partial sections of the partial profile sections resting on top of each other via the adhesive layer take place automatically while curing.

In one preferred embodiment of this invention, sheet metal strips are used as the material strips, and a two-component metal adhesive as the adhesive, in order to obtain a sufficiently stable frame leg which is torsion-resistant.

In another preferred embodiment of this invention, the partial sections to be connected with each other are placed into an edge area of the partial profile strips, and the cured adhesive layers of the partial profile sections are closed in the connecting areas with a closed hollow profile section, a completely sealed closed frame leg is created, which is embodied as a hollow profile section, in a simple manner. Sealing in the connecting areas can be further improved by the partial sections of the one partial profile section enclosing the partial sections of the other partial profile section on both sides.

This invention will be explained in detail by an exemplary embodiment represented in the drawings.

2

BRIEF DESCRIPTION OF THE DRAWINGS

FIG. 1 is an exploded cross-sectional view of two material strips for producing a compound frame leg, according to one preferred embodiment of this invention;

FIG. 2 is an exploded cross-sectional view of the partial profile sections produced in accordance with FIG. 1;

FIG. 3 is a cross-sectional view of one partial profile section, as shown in FIG. 2, provided with adhesive layers; and FIG. 4 is a cross-sectional view of the frame leg produced from the two partial profile sections as shown in FIG. 2.

DESCRIPTION OF PREFERRED EMBODIMENTS

Two material strips 40 and 41 in accordance with FIG. 1 are used to produce the frame leg 10 in accordance with FIG. 4, wherein rows of fastening receptacles and/or bores 13, 14 and 15 are applied in a system grid during a stamping process at the selected places to the material strips 40 and 41 which are preferably embodied as sheet metal strips. In this case the places are selected in such a way that the preformed partial profile section 40' and the fastening receptacles and/or bores 13 and 14 rest in profile sides 11 and 12 which are oriented perpendicularly with respect to each other, while the fastening receptacles and/or bores 15 are positioned in an edge area of the two profile sides 11 and 12.

The partial profile sections 40' and 41' in accordance with FIG. 2 are formed from the sheet metal strips 40 and 41 by a bending process, wherein initially only the profile sides 11 and 12 are formed on the partial profile section 40'. In the edge areas the partial profile section 41 ' has the partial sections 21 and 22 required for the connecting areas.

As shown in FIG. 3, in such embodiment both sides of the partial sections 21 and 22 of the partial profile section 41' have an adhesive layer 50 of a curable adhesive. However, it is also possible to provide the insides of the end sections of the partial profile section 40', in accordance with FIG. 2, facing each other with adhesive layers 50.

As shown in FIG. 4, the partial profile sections 40' and 41' are inserted into each other and the end sections of the partial profile section 40' are bent in a final bending process as partial sections 16 and 17 or 18 and 19 around the partial sections 21 and 22 of the partial profile section 41'. The adhesive layers are cured and the cured adhesive layers 50' complete the production sequence of the frame leg 10. The connecting areas of the two partial profile sections 40' and 41' with their partial sections 16, 17 and 21 or 18, 19 and 22 are solidly, permanently and absolutely sealingly closed, so that a hollow profile section of high stability and torsional stability is created.

The cross section of the compound frame leg 10 and the partial profile sections 40' and 41' used for this can be arbitrarily shaped and adapted to different requirements. At all connecting places of the partial profile sections 40' and 41', it is possible to increase the stability, the torsional stability and the sealing of the produced frame leg by means of cured adhesive layers, with negligible outlay. It is only important to apply the not yet cured adhesive layer prior to or during the production sequence to at least one partial profile section 40' or 41', as long as the partial sections of the connecting areas are still accessible to an adhesive application device prior to or during the production sequence.

What is claimed is:

1. In a frame leg for a rack of a switchgear cabinet, the frame leg having two partial profile strips produced from a plurality of sheet metal strips in a stamping and bending process, wherein end partial sections of the partial profile strips overlap each other with partial sections in connecting areas and are fixed with respect to each other, the improvement comprising:

a two-component metal adhesive is formed into a first curable adhesive layer (50) and a second curable adhesive layer (50), one of prior to and during a stamping and bending process the first curable adhesive layer (50) being attached to a first side of one of the end partial sections (21; 22) of one of the partial profile strips (40', 41') and the second curable adhesive layer (50) being attached to a second side of the one of the end partial sections (21; 22) of the partial profile strips (40', 41'), another of the end partial sections (16, 17; 18, 19) being bent about and enclosing the one end partial section (21; 22), and once cured the first curable adhesive layer (50) and the second curable adhesive layer (50) positioned between and connecting the one of the end partial sections (21; 22) and the another of the end partial sections (16, 17; 18, 19) and in a fixed manner.

* * * * *